United States Patent
Hwang

(10) Patent No.: US 7,279,354 B2
(45) Date of Patent: Oct. 9, 2007

(54) MICROLENS OF CMOS IMAGE SENSOR AND METHOD OF MANUFACTURING THE SAME

(75) Inventor: Joon Hwang, Cheongju (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 11/319,493

(22) Filed: Dec. 29, 2005

(65) Prior Publication Data

US 2006/0145218 A1    Jul. 6, 2006

(30) Foreign Application Priority Data

Dec. 30, 2004    (KR) ...................... 10-2004-0117235

(51) Int. Cl.
*H01L 21/00* (2006.01)
(52) U.S. Cl. ............................ 438/70; 438/48; 438/57; 438/69; 257/E31.121
(58) Field of Classification Search ..................... None
See application file for complete search history.

(56) References Cited

U.S. PATENT DOCUMENTS

2004/0147059 A1 *    7/2004    Jeong et al. .................. 438/70

FOREIGN PATENT DOCUMENTS

| KR | 10-2002-0057277 | 7/2002 |
| KR | 10-2004-0095984 | 11/2004 |

* cited by examiner

*Primary Examiner*—Leonardo Andujar
*Assistant Examiner*—Kevin Quinto
(74) *Attorney, Agent, or Firm*—McKenna Long & Aldridge

(57) ABSTRACT

A method of a microlens of a CMOS image sensor eliminates a flattened gap between the curvatures of adjacent microlenses. A plurality of color filter layers is formed on a semiconductor substrate on which a photodiode region, a gate electrode, an interlayer insulating layer, and a metal interconnection are formed. An overcoating layer is formed on the plurality of color filter layers. Microlenses are formed on the overcoating layer. The overcoating layer exposed by a gap between the microlenses is etched to form a gap at the boundary between the color filter layers in the overcoating layer. A flow process is performed such that curves of the microlenses extend to the gap.

3 Claims, 4 Drawing Sheets

MICROLENS OF CMOS IMAGE SENSOR AND METHOD OF MANUFACTURING THE SAME

CROSS-REFERENCE TO RELATED APPLICATION

This application claims the benefit of Korean Patent Application No. 10-2004-0117235, filed on Dec. 30, 2004, which is hereby incorporated by reference as if fully set forth herein.

BACKGROUND OF THE INVENTION

1. Field of the Invention

The present invention relates to an CMOS image sensor, and more particularly, to a microlens of a CMOS image sensor and a method of manufacturing the same in which light induced at the outside of a photodiode region is directed into the photodiode region to improve photosensitivity

2. Discussion of the Related Art

An image sensor is a semiconductor device for converting an optical image into an electrical signal. A typical complementary metal-oxide-silicon (CMOS) image sensor includes a charge-coupled device, in which charge carriers are stored in metal-oxide-silicon capacitors that are very close to each other, and MOS transistors to correspond to the number of pixels, which are manufactured by the number of pixels using a CMOS technology. Using the MOS transistors, the output signals are detected by a control circuit and a signal processing circuit in a peripheral circuit area.

The CMOS image sensor for converting information of a subject into an electrical signal can include signal processing chips having a photodiode. An amplifier, an analog/digital converter, an internal voltage generator, a timing generator, and digital logic may be connected to one chip, thereby reducing space, power, and cost. The charge coupled device is manufactured through a special method, while the CMOS image sensor is manufactured using a method of etching a silicon wafer, which is cheaper than the method of manufacturing the charge coupled device. Thus, the CMOS image sensor can be advantageously mass produced and have a high degree of integration.

FIGS. 1A-1C illustrate a method of manufacturing a microlens of a CMOS image sensor according to the prior art.

Referring to FIG. 1, components (not shown) such as a photodiode region, a gate electrode, an interlayer insulating layer, and a metal interconnection are formed on a semiconductor substrate 10; a passivation layer 11 is laminated thereon; and a blue filter pattern 12, a red filter pattern 13, and a green filter pattern 14 are formed on the passivation layer 11.

Referring to FIG. 1B, an overcoating layer 15 is formed on the blue filter pattern 12, the red filter pattern 13, and the green filter pattern 14, and a microlens pattern 16 is formed on the overcoating layer 15.

Referring to FIG. 1C, the microlens pattern 16 is subjected to a bleaching process and a flow process to form microlenses 17. When the microlenses 17 are formed, a gap A occurs between the microlenses 17.

FIG. 2 shows a pattern of light concentration of the microlenses 17 formed on the overcoating layer 15. Both sides of the microlens 17 are shielded by a component 18 required for the CMOS image sensor, and the center thereof is exposed. Thus, light passing through the microlens 17 reaches a photodiode 20. As shown in FIG. 2, the light passing through regions B or C reaches the photodiode 20, while light incident to the gap A between the microlenses 17 does not reach the photodiode 20.

The width of the gap A is about 0.1-0.4 μm. If the incident light does not reach the photodiode 20, it is difficult to improve the photosensitivity of the CMOS image sensor.

In the CMOS image sensor according to the related art, the gap exists between the microlenses, and the light incident to the gap is not directed to the photodiode. Thus, it is difficult to improve the photosensitivity of the CMOS image sensor.

SUMMARY OF THE INVENTION

Accordingly, the present invention is directed to a microlens structure of a CMOS image sensor and a method of manufacturing the same that substantially obviates one or more disclosed or undisclosed problems or issues that may be due to limitations and disadvantages of the related art.

The present invention can include a microlens structure of a CMOS image sensor and a method of manufacturing a microlens structure of a CMOS image in which a gap does not exist between the microlenses such that light induced at the outside of a photodiode region is directed into the photodiode region to result in improved photosensitivity.

Additional advantages, objects, and features of the invention will be set forth in part in the description which follows and in part will become apparent to those having ordinary skill in the art upon examination of the following. These and other advantages of the invention may be realized and attained by the structure particularly pointed out in the written description and claims, as well as the appended drawings.

To achieve these and other advantages in accordance with the purpose of the invention, as embodied and broadly described herein, there is provided a microlens structure that includes a plurality of color filter layers on a semiconductor substrate, a photodiode region, a gate electrode, an interlayer insulating layer, and a metal interconnection. An overcoating pattern can be formed on the plurality of color filter layers, and microlenses can be formed on the overcoating pattern.

According to another aspect of the present invention, a method of manufacturing a microlens structure of a CMOS image sensor includes forming a plurality of color filter layers on a semiconductor substrate; forming an overcoating layer on the plurality of color filter layers; forming microlenses on the overcoating layer; etching the overcoating layer exposed by a first gap between the microlenses to form a second gap between the color filter layers in the overcoating layer; and performing a reflow process such that curves of the microlenses extend to the second gap.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention illustrate embodiments of the invention, and together with the description, serve to explain the invention. In the drawings.

DETAILED DESCRIPTION OF THE INVENTION

Reference will now be made in detail to exemplary embodiments of the present invention, examples of which are illustrated in the accompanying drawings. Wherever possible, like reference designations will be used throughout the drawings to refer to the same or similar parts.

Figure 1A:
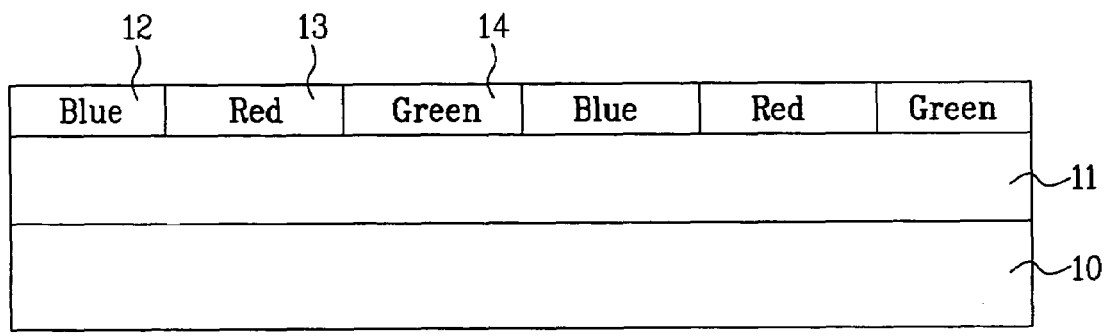
FIGS. 1A-1C are cross-sectional views illustrating a method of manufacturing a microlens of a CMOS image sensor according to the related art.
Figure 1B:
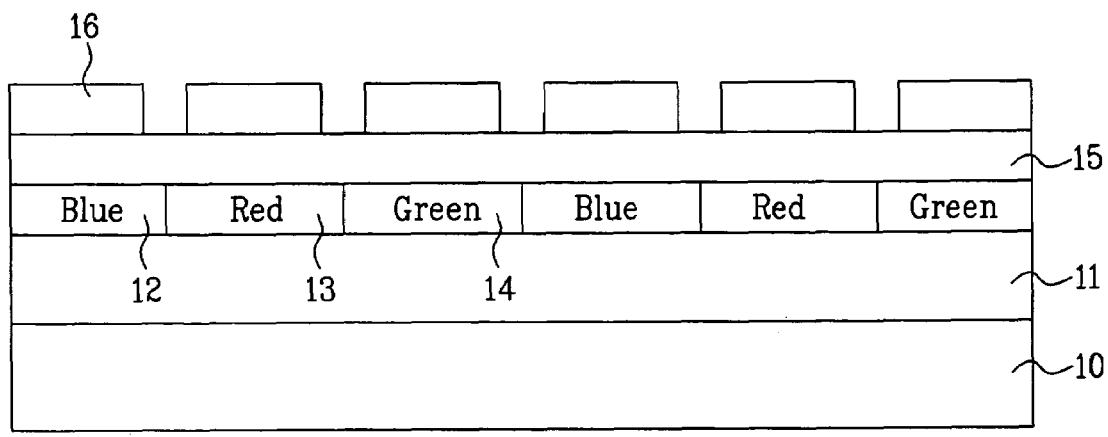
Figure 1C:
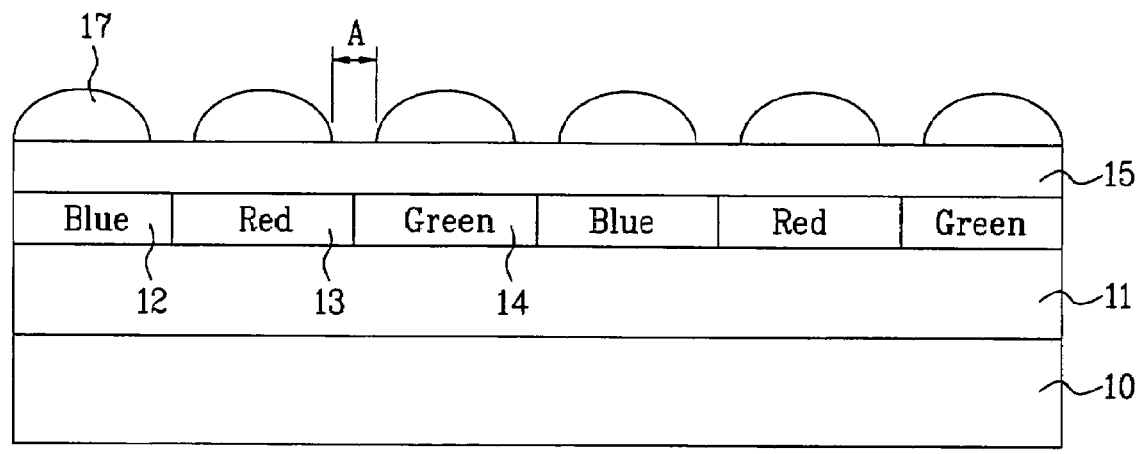
Figure 2:
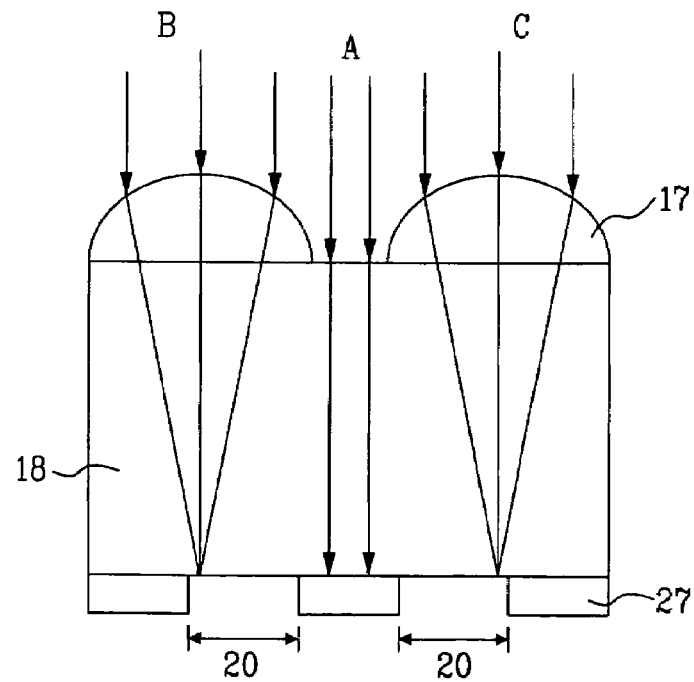
FIG. 2 is a diagram of a pattern of light concentration pattern of the microlens of the prior art.
Figure 3A:
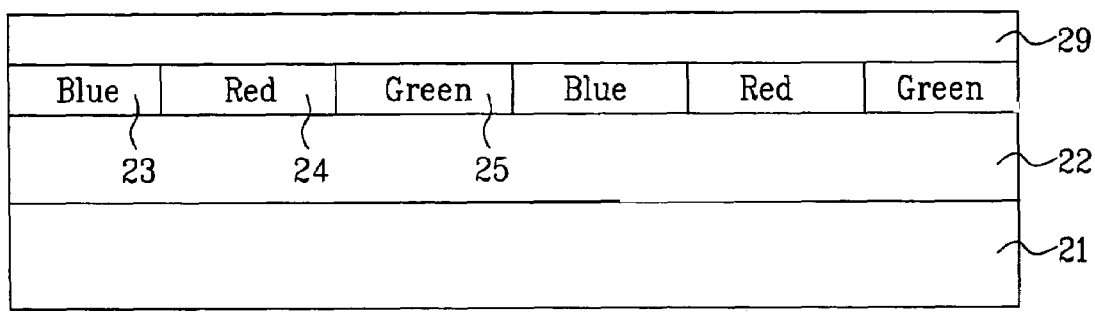
FIGS. 3A-3C are cross-sectional views illustrating a method of manufacturing a microlens of a CMOS image sensor according to the present invention.
Figure 3B:
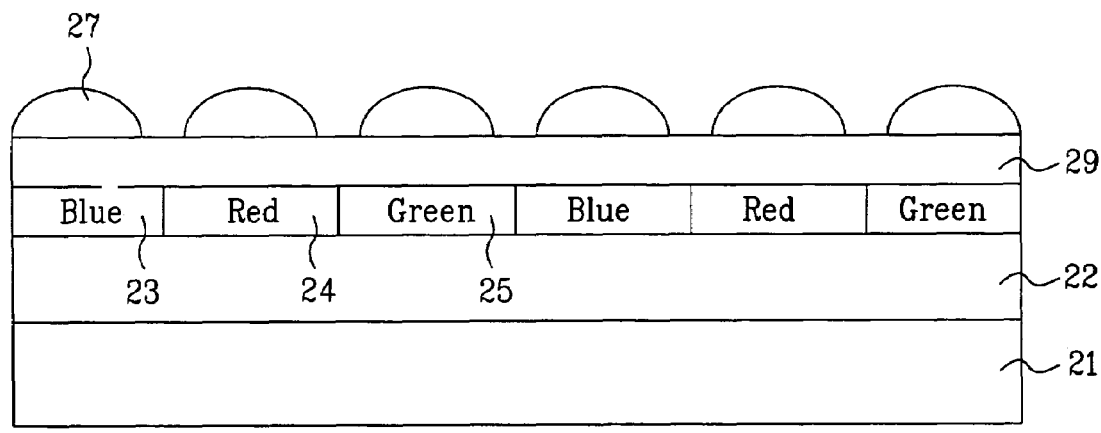
Figure 3C:
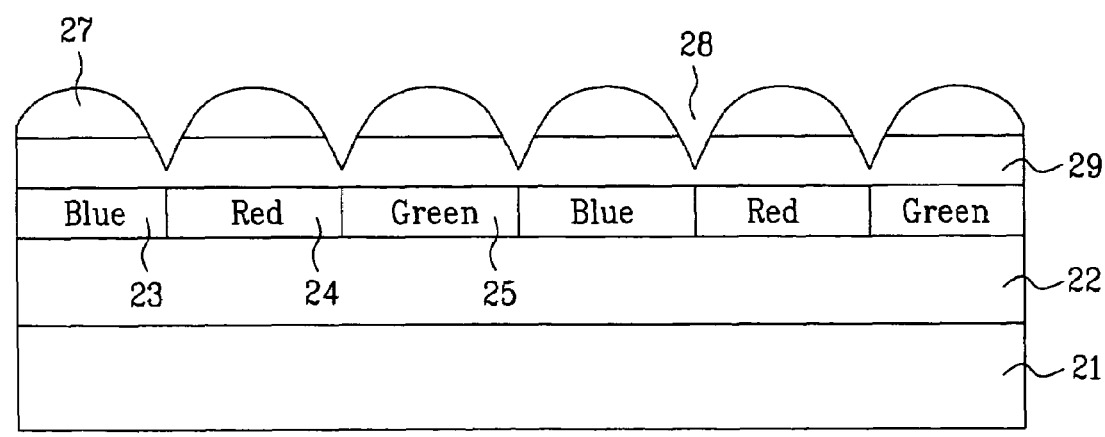

FIGS. 3A-3C illustrate a method of manufacturing a microlens structure of a CMOS image sensor according to the present invention.

Referring to FIG. 3A, components (not shown) such as a photodiode region, a gate electrode, an interlayer insulating layer, and a metal interconnection are formed on a semiconductor substrate 21. A passivation layer 22 is laminated on the substrate 21, and a blue filter pattern 23, a red filter pattern 24, and a green filter pattern 25 are formed on the passivation layer 22. Then, an overcoating layer 29 is formed on the blue filter pattern 23, the red filter pattern 24, and the green filter pattern 25.

Referring to FIG. 3B, a microlens pattern (not shown) is formed on the overcoating layer 29. Then, the microlens pattern is subjected to a bleaching process and a first flow process to form microlenses 27.

Referring to FIG. 3C, the overcoating layer 29 exposed between the microlenses 27 is etched using an O₂ plasma method to form a gap 28. The overcoating layer 29 can be etched using a photosensitive layer. A portion of the overcoating layer 29 and the microlenses 27 is subject to a second flow process such that the curves of the microlenses 27 extend to the gap 28. Particularly, the curves can meet at the boundary between the color filter layers.

Figure 4:
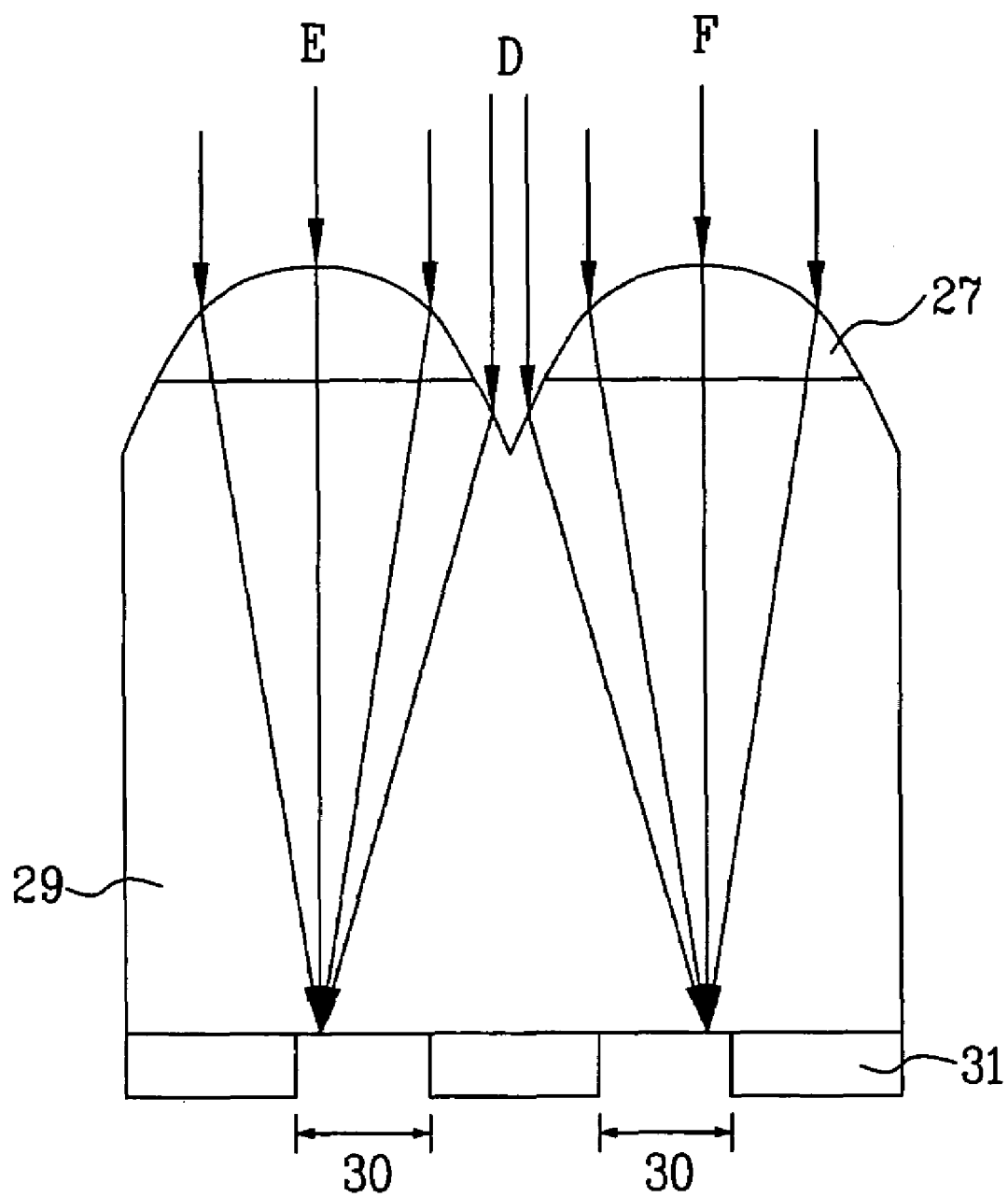
FIG. 4 is a diagram of a pattern of light concentration pattern of the microlens of the present invention.

FIG. 4 shows a pattern of light concentration by the microlens 27 formed on the overcoating layer pattern 29.

Both sides of the microlens 27 are shielded by a CMOS image sensor component 31, and the center thereof is exposed. Thus, light passing through the microlenses 27 reaches a photodiode 30. That is, the light passing through regions E or F reaches the photodiode 30. Moreover, since the curvature of the microlenses 27 extends to form the gap in the overcoating layer 29, light incident to a gap region D located between the microlenses 27 is directed to the photodiode 30. In effect, the present invention eliminates a flattened gap between microlenses.

Accordingly, the light incident to the outside of the photodiode region is directed into the photodiode region, and thus, the photosensitivity can be significantly improved. Moreover, a high integration can be realized by forming the microlens using as large area as possible.

It will be apparent to those skilled in the art that various modifications can be made in the present invention without departing from the spirit or scope of the invention. Thus, it is intended that the present invention covers such modifications provided they come within the scope of the appended claims and their equivalents.

What is claimed is:

1. A method of manufacturing a microlens structure of a CMOS image sensor, comprising:

forming a plurality of color filter layers on a semiconductor substrate on which a photodiode region, a gate electrode, an interlayer insulating layer, and a metal interconnection are formed;

forming an overcoating layer on the plurality of color filter layers;

forming microlenses on the overcoating layer;

etching the overcoating layer exposed by a first gap between the microlenses to form a second gap between the color filter layers in the overcoating layer; and performing a reflow process such that curves of the microlenses extend to the second gap.

2. The method according to claim 1, wherein the flow process is performed on a portion of the overcoating layer and the microlenses such that the curves of the microlenses extend to the second gap.

3. The method according to claim 1, wherein the overcoating layer is etched using O₂ plasma.

* * * * *